(12) United States Patent
Sargent et al.

(10) Patent No.: US 7,906,772 B2
(45) Date of Patent: Mar. 15, 2011

(54) MEMORY DEVICE

(75) Inventors: David Sargent, Manassas, VA (US); Jon Maimon, Manassas, VA (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 11/849,632

(22) Filed: Sep. 4, 2007

(65) Prior Publication Data

US 2009/0057642 A1   Mar. 5, 2009

(51) Int. Cl.
*H01L 29/02* (2006.01)
(52) U.S. Cl. .. 257/2; 257/3; 257/4; 257/5; 257/E29.002; 438/102; 438/103; 365/163
(58) Field of Classification Search .................. 257/2–5, 257/E29.002; 438/102–103; 365/163
See application file for complete search history.

(56) References Cited

U.S. PATENT DOCUMENTS

| 2002/0017701 A1* | 2/2002 | Klersy et al. ................. 257/536 |
| 2002/0045323 A1* | 4/2002 | Lowrey et al. ................. 438/382 |
| 2009/0095949 A1* | 4/2009 | Kostylev et al. ................. 257/3 |

OTHER PUBLICATIONS

"Conformal" Merriam-Webster Online Dictionary. 2007, http://www.merriam-webster.com (Apr. 11, 2010).*

* cited by examiner

Primary Examiner — Thanh V Pham
Assistant Examiner — Jami M Valentine
(74) Attorney, Agent, or Firm — Honigman Miller Schwartz and Cohn LLP

(57) ABSTRACT

A memory or switching device includes a mesa and a first electrode conforming to said mesa. The device also includes a second electrode and a phase-change or switching material disposed between said first and second electrodes. The phase-change or switching material is in electrical communication with the first and second electrodes at a first contact region and a second contact region respectively. Also described is a method for making a memory or switching device. The method includes providing a first insulator and configuring the first insulator to provide a mesa. A first conductive layer is provided conforming to the mesa. A phase-change or switching material is provided over a portion of the first conductive layer, and a second conductive layer is provided over the phase-change or switching material.

32 Claims, 6 Drawing Sheets

MEMORY DEVICE

TECHNICAL FIELD

The embodiments described herein are generally directed to memory devices including a phase-change material or electronic switching devices.

BACKGROUND

Non-volatile memory devices are used in certain applications where data must be retained when power is disconnected. Applications include general memory cards, consumer electronics (e.g., digital camera memory), automotive (e.g., electronic odometers), and industrial applications (e.g., electronic valve parameter storage). The non-volatile memories may use phase-change memory materials, i.e., materials that can be switched between a generally amorphous and a generally crystalline state, for electronic memory applications. The memory of such devices typically comprises an array of memory elements, each element defining a discrete memory location and having a volume of phase-change memory material associated with it. The structure of each memory element typically comprises a phase-change material, one or more electrodes, and one or more insulators.

One type of memory element originally developed by Energy Conversion Devices, Inc. utilizes a phase-change material that can be, in one application, switched between a structural state of generally amorphous and generally crystalline local order or between different detectable states of local order across the entire spectrum between completely amorphous and completely crystalline states. These different structured states have different values of resistivity and therefore, each state can be determined by electrical sensing. Typical materials suitable for such applications include those utilizing various chalcogenide materials. Unlike certain known devices, these electrical memory devices typically do not use field-effect transistor devices as the memory storage element. Rather, they comprise in the electrical context, a monolithic body of thin film chalcogenide material. As a result, very little area is required to store a bit of information, thereby providing for inherently high-density memory chips.

The state change materials are also non-volatile in that, when set in either a crystalline, semi-crystalline, amorphous, or semi-amorphous state representing a resistance value, that value is retained until reprogrammed, as that value represents a physical state of the material (e.g., crystalline or amorphous). Further, reprogramming requires little energy to be provided and dissipated in the device. Thus, phase-change memory materials represent a significant improvement in non-volatile memory technology.

In addition to memory elements, switching elements, particularly fast switching devices, are desirable for a number of applications. Fast switching elements are capable of being switched between a relatively resistive state and a relatively conductive state and are useful as voltage clamping devices, surge suppression devices, and signal routing devices. Fast switching elements can also be used as access devices in memory arrays.

An important class of fast switching materials are the Ovonic Threshold Switch ("OTS") materials. OTS materials, like many phase-change memory materials, typically include one or more chalcogen elements. Unlike phase-change memory materials, however, the compositions of OTS materials are such that no change in structural state occurs within the range of normal operation of the material. Instead, the OTS material retains an overall predominantly amorphous structure during operation. Application of a suitable energy signal, typically an electrical energy signal having a voltage above a critical threshold level, induces a change of the OTS material from a relatively resistive quiescent state to a relatively conductive transient state. The relatively conductive state persists for so long as the current passing through the OTS material remains above a critical holding level. Once the energy signal is removed or the current otherwise decreases below the level needed to sustain the relatively conductive state, the OTS material relaxes back to its relatively resistive quiescent state.

In an effort to improve scaling of the memory device or switching device to increase the density of memory arrays, one technique is to reduce the area of a bottom contact. Current methods to reduce bottom contact areas may be to create pores, or holes, through an insulator that expose the bottom contact. However, pores are difficult to manufacture in sublithographic dimensions. Moreover, sublithographic pores may be difficult to mass-produce consistently. Additionally, pore-exposed bottom electrodes typically require chemical vapor deposition (CVD) to achieve conformal filling of the pore with a phase-change or switching material and good contact with the bottom electrode. CVD methods may add to manufacturing time and costs.

Therefore, a need has arisen to produce an improved bottom electrode for a phase-change memory device. Moreover, it is desirable to reduce the manufacturing costs and process difficulties for producing the bottom contact, especially at dimensions approaching or entering the sublithographic regime.

SUMMARY

A memory device includes a mesa and a first electrode conforming to said mesa. The memory device also includes a second electrode and a phase-change material disposed between said first and second electrodes. The phase-change material is in electrical communication with the first and second electrodes at a first contact region and a second contact region respectively.

A switching device includes a mesa and a first electrode conforming to said mesa. The switching device also includes a second electrode and a switching material disposed between said first and second electrodes. The switching material is in electrical communication with the first and second electrodes at a first contact region and a second contact region respectively.

Another memory device may include a mesa and a first electrode deposited over the mesa having a first contact region. A contact insulation layer partially surrounds the first electrode, the contact insulation layer and the first contact region being substantially coplanar. A phase-change layer is deposited over the first contact region. A second electrode is deposited over the phase-change layer and has a second contact region. The first and second contact regions are in electrical communication with the phase-change material.

Another switching device may include a mesa and a first electrode deposited over the mesa having a first contact region. A contact insulation layer partially surrounds the first electrode, the contact insulation layer and the first contact region being substantially coplanar. A layer of switching material is deposited over the first contact region. A second electrode is deposited over the switching material and has a second contact region. The first and second contact regions are in electrical communication with the switching material.

Also described is a method for making a memory device. The method includes providing a first insulator and configuring the first insulator to provide a mesa. A first conductive layer is provided conforming to the mesa. A phase-change material is provided over a portion of the first conductive layer, and a second conductive layer is provided over the phase-change material.

Also described is a method for making a switching device. The method includes providing a first insulator and configuring the first insulator to provide a mesa. A first conductive layer is provided conforming to the mesa. A phase-change material is provided over a portion of the first conductive layer, and a second conductive layer is provided over the switching material.

BRIEF DESCRIPTION OF THE DRAWINGS

The features and inventive aspects will become more apparent upon reading the following detailed description, claims, and drawings, of which the following is a brief description:

DETAILED DESCRIPTION

Figure 1:
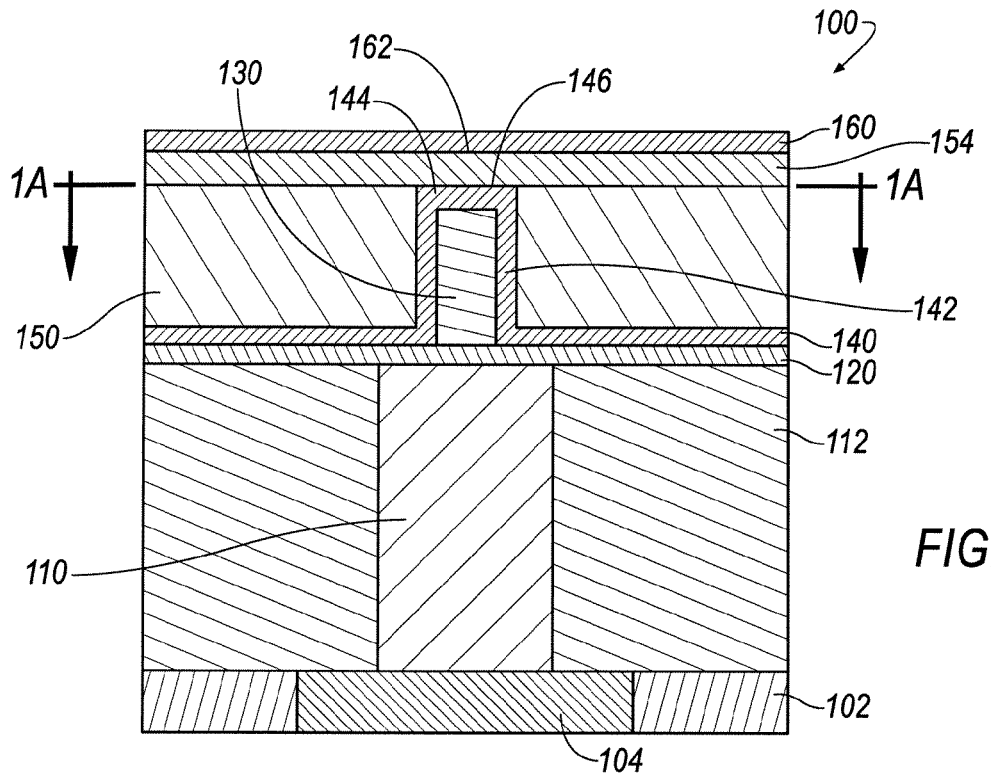
FIG. 1 is a cross-sectional view of a phase-change memory device.

Referring now to the drawings, illustrative embodiments are shown in detail. Although the drawings represent the embodiments, the drawings are not necessarily to scale and certain features may be exaggerated to better illustrate and explain novel aspects of an embodiment. Further, the embodiments described herein are not intended to be exhaustive or otherwise limit or restrict the claims to the precise form and configuration shown in the drawings and disclosed in the following detailed description.

Embodiments of a memory device, including a phase-change memory material, and a switching device are described in detail herein. A phase-change layer or switching layer is provided between a first and second electrode that are in electrical communication with the phase-change layer or switching layer. The first electrode is constructed upon a mesa structure that may be configured as a sublithographic feature. When using a sublithographic embodiment for the mesa and first electrode, the contact area of the first electrode is reduced which in turn reduces the programming current of a memory device or a switching device. Additionally, a sublithographic post may be less complex and less expensive to process than a sublithographic pore-type device. In providing the first electrode, a physical vapor deposition (PVD) process may be used.

The memory device may be written to and read in a manner described in U.S. Pat. No. 6,687,153, issued Feb. 3, 2004, to Lowrey, for "Programming a Phase-Change Material Memory", which is hereby incorporated by reference in its entirety, as well as other methods known to those skilled in the art. The memory device may also be configured as an array of devices such that a high-density memory array is created. The switching device may have the operational characteristics of an Ovonic Threshold Switching device, such as the ones described in U.S. Pat. Nos. 5,543,737; 5,694,146; 5,757,446; and 6,967,344; the disclosures of which are hereby incorporated by reference in their entirety. The switching material is generally a material having a resistive state and a conductive state, where a transformation between the resistive state and conductive state may be induced upon application of an electric field, electric current or voltage across the material. In a preferred embodiment, the switching material is reversibly transformable between the resistive and conductive states.

In yet another aspect, the memory device may be configured to provide multi-level storage. That is to say, the memory device may have a plurality of discrete and identifiable states allowing for multi-bit storage in a single memory element, rather than a common binary storage element. The phase-change memory material may be configured, along with adjacent structures, to facilitate multi-level storage in an improved manner.

As discussed herein, the term "electrical communication" is intended to mean that two or more structures allow electrical current to flow from one structure to another. In one example, electrical communication may arise from direct contact of one material to another. In another example, electrical communication may include an intermediate structure such as a carbon layer, a phase-change material, and/or a metal structure that facilitates or enables electrical current flow between structures. Such a structure, in the example of a carbon layer, may be desirable when the carbon layer is used as an etch-stop in a fabrication process to modify the resistivity of a contact. Alternatively, the conductive structure may reduce metal migration between two dissimilar materials. Thus, the term electrical communication is not limited merely to two physically contacting structures. Additionally, as discussed herein, a "mesa" may include a post-like structure that extends beyond a surface and may also include protrusions that extend from a surface. The mesa may be cylindrical, rectangular, or otherwise shaped in a predetermined fashion. The mesa may have vertical sidewalls or sloped sidewalls.

FIG. 1 is a cross-sectional view of a phase-change memory device 100. Memory device 100 includes a mesa 130, a first electrode 140, a phase-change layer 154, and a second electrode 160. A portion of phase-change layer 154 that is between first electrode 140 and second electrode 160 provides an active area for the memory storage functionality. An analogous switching device may be achieved by substituting a layer of switching material, such as a threshold switching material, for the phase-change layer 154.

Supporting structures include a lower isolation layer 102, a lower conductive layer 104, a bottom interconnect 110, a interconnect insulation layer 112, a contact insulator 150, and optional lower metal film 120. Lower isolation layer 102 may be made of, for example, $SiO_2$ (silicon dioxide) or other insulators, and is readily deposited by techniques such as chemical vapor deposition (CVD), physical vapor deposition (PVD), or sputtering. In general, lower isolation layer 102 is optional but may be provided to electrically and thermally insulate memory device 100 from other circuitry that may be constructed below memory device 100.

Bottom interconnect 110 may be made of a conductive material, such as aluminum, tungsten, or copper, and electrically connects memory device 100 to external circuitry (not shown) via lower conductive layer 104 for the reading and writing operations of memory device 100. Interconnect insulation layer 112 may be made of $SiO_2$ (silicon dioxide) or other insulators, and electrically and thermally insulates bottom interconnect 110 from other interconnects and adjacent structures.

Contact insulator 150 is deposited as a layer and surrounds first electrode 140 in a co-planar manner. Contact insulator 150 generally insulates phase-change layer 154 from bottom interconnect 110 and other structures. Moreover, contact insulator 150 provides a generally planar surface along with an upper portion 144 of first electrode 140 for the deposition of phase-change layer 154.

Optional lower metal film 120 is deposited over bottom interconnect 110 and interconnect insulation layer 112. Optional lower metal film 120 covers certain lower features, including bottom interconnect 110 and interconnect insulation layer 112. Optional lower metal film 120 may also be used as an etch-stop that is used to prevent further patterning of existing lower features in subsequent manufacturing processes. Additionally, optional lower metal film 120 provides a consistent surface allowing for the construction of mesa 130 and first electrode 140. Moreover, optional lower metal film 120 may be selected of a material to reduce metal migration. That is to say, optional lower metal film 120 may behave as a barrier to metal migration between bottom interconnect 110 and first electrode 140. Optional lower metal layer 120 and first electrode 140 are preferably patterned to maintain isolation of memory device 100 from adjacent devices in an array of devices.

Second electrode 160 may be a conductive metal film that is deposited over phase-change layer 154. Second electrode 160 may be patterned to electrically connect memory device 100 to external circuitry (not shown) for the reading and writing operations of memory device 100. When memory device 100 is in operation, second electrode 160 and first electrode 140 are used to read and write memory device 100.

First electrode 140 includes a vertical portion 142 and upper portion 144. First contact region 146 is part of the conductive structure of first electrode 140 that is formed over mesa 130. First contact region 146 is in electrical communication with phase-change layer 154. First electrode 140 is typically a metal deposited by physical vapor deposition (PVD). When constructed, first electrode 140 is deposited typically by physical vapor deposition (PVD) over mesa 130 and provides vertical portion 142 and upper portion 144 that are built up respectively on the sides and top of mesa 130. Mesa 130 supports first electrode 140 and may also be referred to as an electrode support. Mesa 130 is generally a region protruding from a substrate. The substrate may be a base wafer and may include circuitry, structure or underlying layers. Mesa 130 includes a top surface remote from the substrate and a sidewall surface that connects the top surface to the substrate. In the embodiment shown in FIG. 1, the sidewalls of mesa 130 are vertical and the vertical cross-section of mesa 130 is rectangular. In other embodiments, the mesa sidewalls may be non-vertical. Non-vertical sidewalls include linearly sloped sidewalls, where the vertical cross-section of the mesa is trapezoidal or triangular. Non-vertical sidewalls further include curved or non-linear sidewalls.

Mesa 130 is constructed from a layer of insulator material, for example $SiO_2$ (silicon dioxide) or silicon nitride ($Si_3N_4$), placed atop optional lower metal film 120. Mesa 130 is then configured as a post structure using lithographic and/or sub-lithographic processes. In an example where mesa 130 is constructed from a layer of silicon nitride ($Si_3N_4$), a gas containing a fluorine may be used as an etchant for reactive ion etching (RIE) of the insulator layer. Depending upon the time of exposure or etch conditions, the diameter (or width in cross-section as shown here) of mesa 130 may be controlled. Thus, the sublithographic size of mesa 130 may be easily produced by controlling etching time and/or other process parameters.

After mesa 130 is formed, first electrode 140, including vertical portion 142 and upper portion 144, is deposited using a physical vapor deposition (PVD) or other process Thus, by the deposition of first electrode 140, first contact region 146 is formed initially based on the general size and shape of mesa 130. In this way, first contact region 146 may be defined as a sublithographic dimension when mesa 130 is similarly configured as a sublithographic dimension. Moreover, the overall diameter of first contact region 146 may further be determined by the thickness of deposition of the material for first electrode 140. For example, where more material is deposited for first electrode 140, first contact region 146 will be wider and vertical portion 142 will be thicker.

First contact region 146 is in electrical communication with phase-change layer 154. The electrical communication may be direct contact of first contact region 146 to phase-change layer 154. Alternatively, there may also be a conductive layer between them. For example, a carbon layer (not shown) may be deposited between phase-change layer 154 and first contact region 146 that provides conductivity therebetween but prevents physical contact. Such a carbon layer may be used as an etch-stop or to reduce migration between phase-change layer 154 and first electrode 140. Additionally, a carbon layer may be provided therebetween to modify the resistance between first contact region 146 and phase-change layer 154. When a conductive layer is placed between phase-change layer 154 and first contact region 146, they remain in electrical communication and read and write operations may be performed.

In general, additional conductive layers (e.g., carbon) may be used between bottom and/or contact regions 146, 162 to modify contact resistance, reduce metal migration (e.g., provide a metal migration barrier), provide an etch stop, etc. In one example, first contact region 146 directly interfaces phase-change layer 154 to provide the electrical contact. In another example, a conductive layer such as a carbon layer (not shown) may be provided between first contact region 146 and phase-change layer 154. In another example, second contact region 162 directly interfaces phase-change layer 154 to provide electrical communication. Alternatively, a conductive layer such as a carbon layer (not shown) may be provided between second contact region 162 and phase-change layer 154 as an etch-stop and/or to modify the contact resistance. As shown in FIG. 1, second contact region 162 electrically communicates with phase-change layer 154 through direct contact.

Second electrode 160 may be positioned opposite first contact region 146 on the opposite side of phase-change layer 154. Second electrode 160 may be formed as a layered structure that is larger in contact area (e.g., second contact region 162) than first contact region 146. Alternatively, second electrode 160 may be formed as a ring structure or a circular structure that may be similarly sized, or larger, in area to first contact region 146. Second contact region 162 may be configured as a square region, a rectangular region, or other geometries.

When memory device 100 is in operation, current flows from bottom interconnect 110 through optional lower metal film 120 to first electrode 140, along vertical portion 142, to upper portion 144. Current then flows from first contact region 146 (of upper portion 144) through phase-change layer 154 and to second electrode 160 where it may further connect to external circuitry. A carbon layer, or other conductive layer, may be placed between second electrode 160 and phase-change layer 154 and/or between phase-change layer 154 and first contact region 146. An active region of memory device 100 includes the phase-change material (of phase-change layer 154) that is between first contact region 146 and the portion of second contact region 162 (that is the part of second electrode 160 substantially opposite first contact region 146).

Phase-change layer 154 is provided as a layer of phase-change memory material, such as a chalcogenide, and is in electrical communication with first electrode 140 and second electrode 160. Phase-change layer 154 may be a Ge—Sb—Te ternary alloy such as a $Ge_2Sb_2Te_5$ chalcogenide alloy (hereinafter referred to as GST225). As used herein, the term phase-change memory material refers to a material capable of changing between two or more phases that have distinct electrical characteristics. Phase-change layer 154 preferably includes at least one chalcogen element selected from Te and Se, and may further include one element selected from the group consisting of Ge, Sb, Bi, Pb, Sn, As, S, Si, P, O, N, In and mixtures thereof. Suitable phase-change materials include, but are not limited to, GaSb, InSb, InSe, $Sb_2Te_3$, GeTe, $Ge_2Sb_2Te_5$, ternary Ge—Sb—Te compositions, InSbTe, ternary In—Sb—Te compositions, ternary GaSeTe compositions, TAG and other ternary Te—As—Ge compositions, GaSeTe, $SnSb_2Te_4$, InSbGe, ternary In—Sb—Ge compositions, AgInSbTe, quaternary Ag—In—Sb—Te compositions, (GeSn)SbTe, quaternary Ge—Sn—Sb—Te compositions, GeSb(SeTe), quaternary Ge—Sb—Se—Te compositions, and $Te_{81}Ge_{15}Sb_2S_2$ and quaternary Te—Ge—Sb—S compositions. In switching device embodiments of the instant invention, the switching material may be selected from those compositions among the foregoing that demonstrate little or no tendency to undergo a structural or phase transformation under the conditions of device operation. The switching materials are preferably chalcogenide or pnictide materials that are amorphous and remain amorphous under the current and voltage conditions used to induce the switching transformation.

The resistivity of chalcogenides generally varies by two or more orders of magnitude when the chalcogenide material changes phase from an amorphous state (more resistive) to a polycrystalline state (less resistive). Electrodes 140, 160, deliver an electric current to the phase-change memory material. As the electric current passes from first electrode 140 to second electrode 160 through phase-change layer 154, at least a portion of the electric energy of the electron flow is transferred to the surrounding material as heat. That is, the electrical energy is converted to heat energy via Joule heating. The amount of electrical energy converted to heat energy increases with the resistivity of the electrical contact (and memory material) as well as with the current density (i.e., current divided by area), passing through the electrical contact and the memory material.

In the operation of memory device 100, first electrode 140 and second electrode 160 are connected to support circuitry (not shown) for programming (e.g., writing information) and reading memory device 100. The support circuitry may include the capability to program and read memory device 100 in binary mode, which provides two states, as well as a multi-level mode, which provides a variable number of states.

When combined with support circuitry, first electrode 140 is provided with a source current that flows through phase-change layer 154 to second electrode 160. When phase-change layer 154 is heated, the resulting region behaves as the data storage region of the device at the active region. When the active region is heated and then cooled slowly, the active region may cool in a crystalline "set" state, which is a low resistance state. When the active region is heated and cooled rapidly, the active region may cool in an amorphous "reset" state, which is a high resistance state. The device resistance is read between electrodes 140, 160 to determine the "set" or "reset" state.

Lower isolation layer 102 and capping insulator (not shown) prevent leakage of current from memory device 100 to surrounding structures. When a source current is provided between first electrode 140 and second electrode 160, an electrical circuit path is formed from first electrode 140 through phase-change layer 154 and to second electrode 160. Because electrodes 140, 160 are opposite each other relative to phase-change layer 154, there is a substantially direct (e.g., vertical) flow of current. That is to say, the current density of the source current is substantially vertical from first electrode 140 to second electrode 160 with minimal dispersion through phase-change layer 154.

Figure 1A:
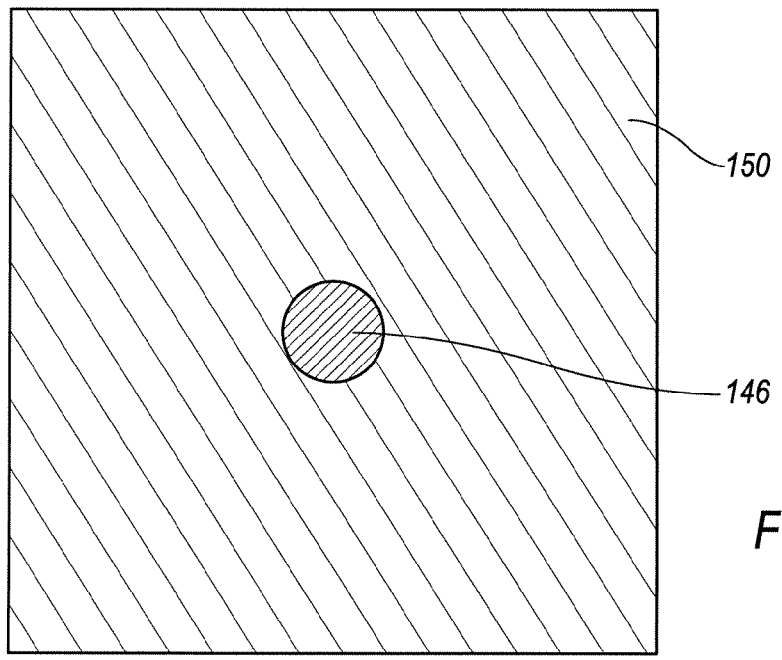
FIG. 1A is a top view of a first contact region and a contact insulator taken from section lines 1A of FIG. 1.

FIG. 1A is a top view of first contact region 146 and contact insulator 150 taken from section lines 1A of FIG. 1. First contact region 146 is generally circular or round and is defined generally by the size and shape of mesa 130 (see FIG. 1), which it is built upon. Contact insulator 150 surrounds first contact region 146 and electrically and thermally insulates phase-change layer 154 (see FIG. 1) from structures under phase-change layer 154 other than providing access to first contact region 146.

Figure 2:
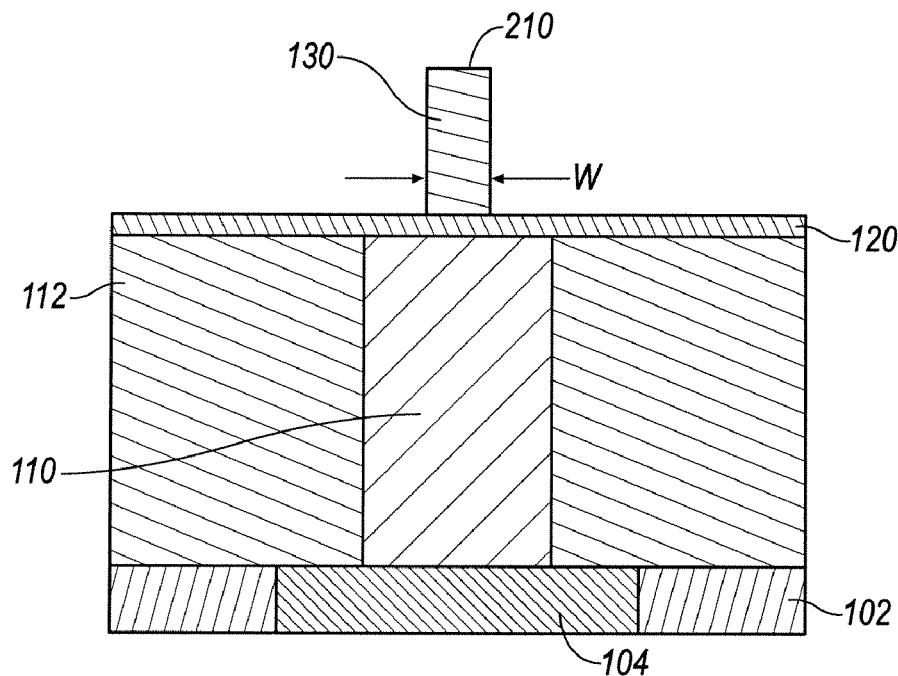
FIG. 2 is a cross-sectional view of the phase-change memory device of FIG. 1 at a first intermediate stage of fabrication.

FIG. 2 is a cross-sectional view of phase-change memory device 100 of FIG. 1 at a first intermediate stage of fabrication. Mesa 130 is constructed upon optional lower metal film 120. During etching, the width W of mesa 130 is controlled by process variables such as mesa material, e.g. silicon nitride ($Si_3N_4$), etchant type, etchant concentration, time, etc. Thus, width W of mesa 130 may be reduced to a sublithographic dimension and shrunk to a size that reliably maintains its position during subsequent manufacturing processes and stresses. During the etching of mesa 130, a top portion 210 is configured that will receive first electrode 140 that forms first contact region 146. As indicated hereinabove, the sidewalls of mesa 130 may be non-vertical.

Figure 3:
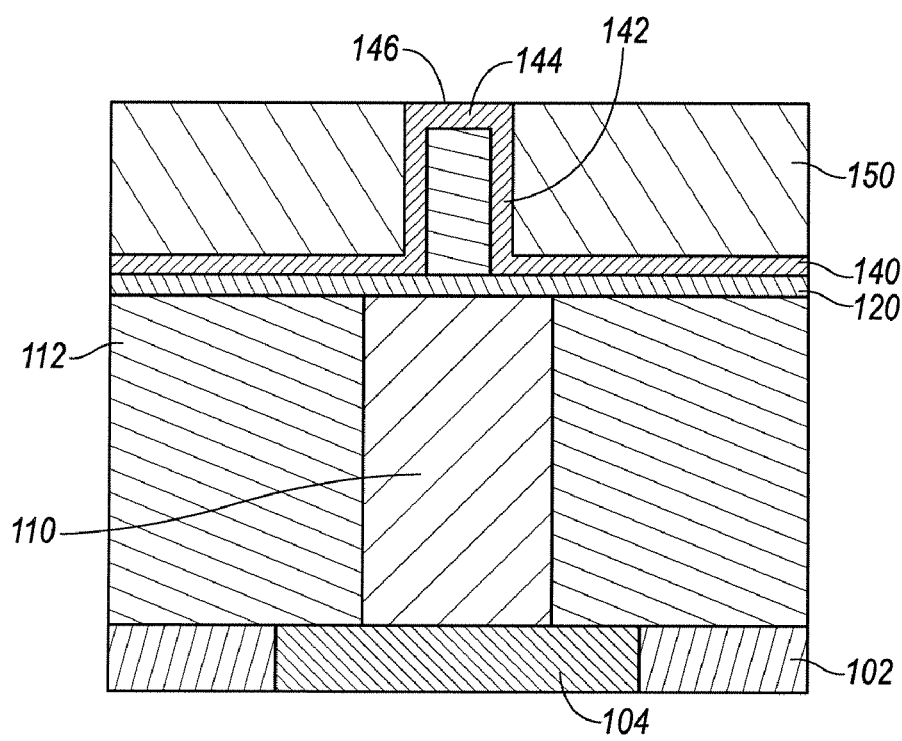
FIG. 3 is a cross-sectional view of the phase-change memory device of FIG. 1 at a second intermediate stage of fabrication.

FIG. 3 is a cross-sectional view of phase-change memory device 100 at a second intermediate stage of fabrication. First electrode 140 has been deposited (typically by physical vapor deposition (PVD)) over optional lower metal film 120 and mesa 130. Contact insulator 150 was deposited over first electrode 140 and first contact region 146 and was processed to a flat surface (e.g., a generally planar surface) using a chemical mechanical polishing (CMP) process. The finished surface of contact insulator 150 is generally co-planar with first contact region 146. The generally planar surface then receives phase-change layer 154 and second electrode 160. As indicated hereinabove, optional lower metal layer 120 and first electrode 140 are preferably patterned to maintain isolation of memory device 100 from adjacent devices in an array of devices.

Figure 4A:
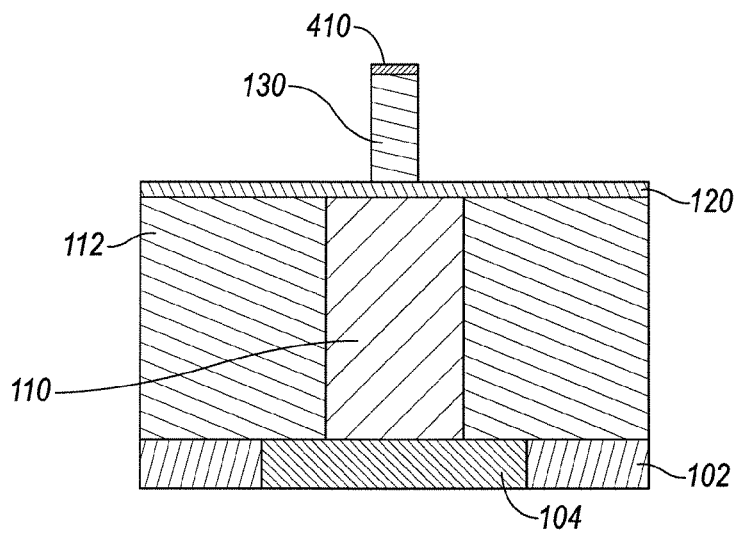
FIG. 4A is a cross-sectional view of an alternative phase-change memory device of FIG. 4C at a first intermediate stage of fabrication.
Figure 4B:
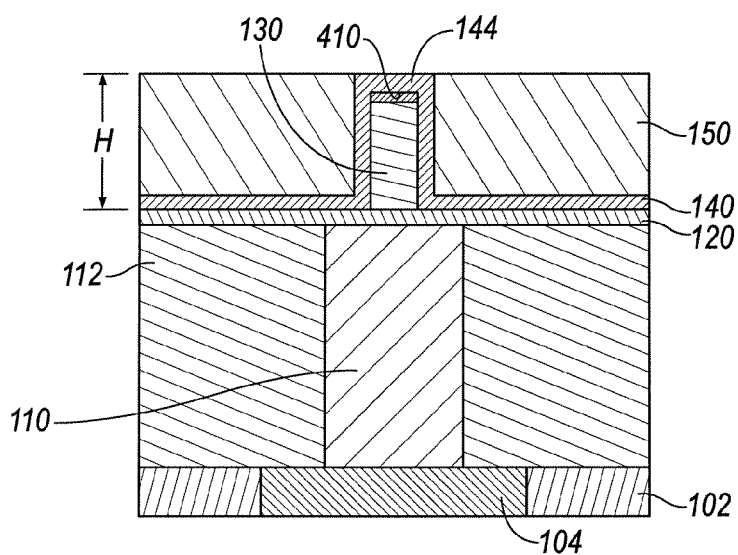
FIG. 4B is a cross-sectional view of an alternative phase-change memory device of FIG. 4C at a second intermediate stage of fabrication.
Figure 4C:
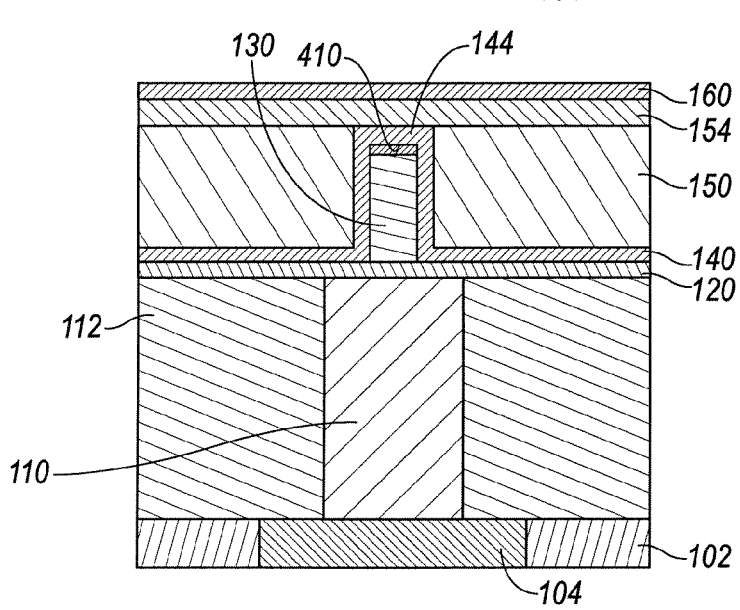
FIG. 4C is a cross-sectional view of alternative phase-change memory device including a spacer.

FIG. 4A is a cross-sectional view of phase-change memory device 400 of FIG. 4C at a first intermediate stage of fabrication. When mesa 130 is etched, a spacer 410 remains atop mesa 130. Spacer 410 may function during manufacturing as an etch-stop portion or simply as a spacer. Spacer 410 may be made from carbon or carbon nitride that was deposited as a layer above the insulator material. The carbon or carbon nitride layer may then be patterned as an etch-stop for constructing mesa 130.

FIG. 4B is a cross-sectional view of phase-change memory device 400 of FIG. 4C at a second intermediate stage of fabrication. First electrode 140 may be deposited over optional lower metal film 120, mesa 130, and spacer 410. Thus, the overall height H of upper portion 144 above optional lower metal film 120 is determined by the height of mesa 130, the thickness of spacer 410, and the thickness of first electrode 140 itself. The thickness of spacer 410 may be modified to adjust the height of the post structure created by mesa 130 and spacer 410. In an example, a "thick" layer of material for spacer 410 creates a "tall" mesa 130 post structure having a large height H. Alternatively, a "thin" layer of spacer 410 material creates a "short" mesa 130 post structure having a small height H.

FIG. 4C is a cross-sectional view of alternative phase-change memory device 400, including spacer 410. In general, phase-change memory device 400 operates similarly to memory device 100 of FIG. 1. However, memory device 400 includes spacer 410 that allows for the adjustment of the height of mesa 130. Thus, where a thicker contact insulator 150 is desired, the thickness of spacer 410 may be increased. Alternatively, the thickness of spacer 410 may be decreased where a shorter post structure is desired.

Figure 5:
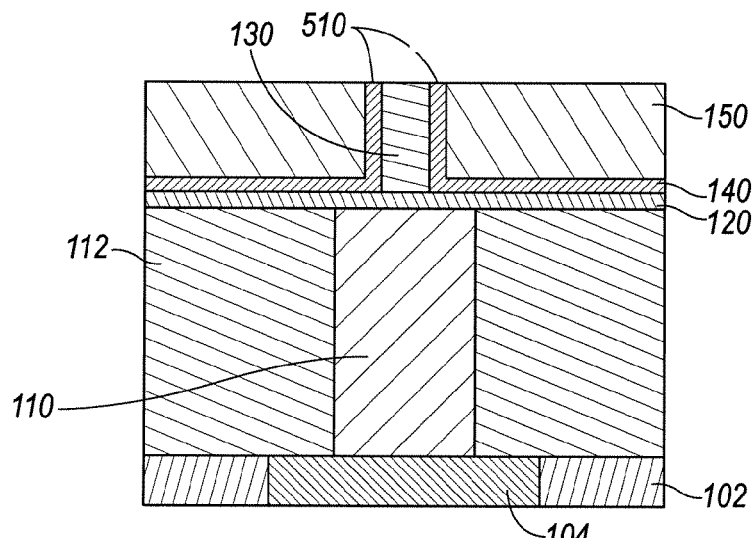
FIG. 5 is a cross-sectional view of an alternative phase-change memory device of FIG. 6 at a first intermediate stage of fabrication.
Figure 6:
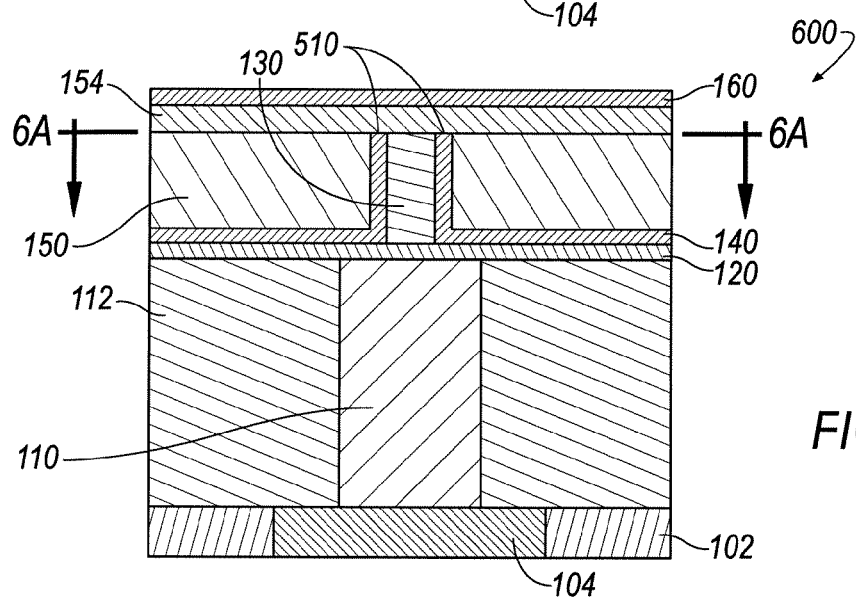
FIG. 6 is a cross-sectional view of an alternative phase-change memory device.

FIG. 5 is a cross-sectional view of phase-change memory device 600 of FIG. 6 at a first intermediate stage of fabrication. Taking the partially manufactured memory device of FIG. 3, the planar surface of upper portion 144 and contact insulator 150 may be partially removed. In an example, a CMP process is used to remove upper portion 144 as well as a predetermined amount of contact insulator 150 (e.g., that is at least as thick as upper portion 144). Once removed, an annular or circumferential contact region 510 remains.

FIG. 6 is a cross-sectional view of an alternative phase-change memory device 600. Phase-change layer 154 is deposited over annular contact region 510 and contact insulator 150. Second electrode 160 is then deposited over phase-change layer 154 to complete the device. Annular contact region 510 provides a reduced area contact in comparison with first contact region 146 of FIGS. 1 and 4C. Thus, current densities are more highly concentrated at annular contact region 510 than the generally circular-shaped first contact region 146 (see FIG. 1A). Because upper portion 144 (see FIG. 3) was removed in processing, mesa 130 is now at the same planar level as annular contact region 510 and contact insulator 150. If desired, mesa 130 may also be partially removed to reduce the overall device thickness.

Figure 6A:
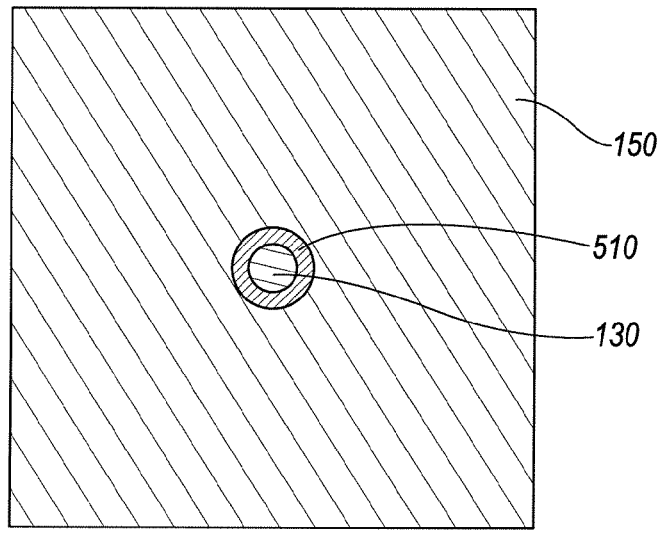
FIG. 6A is a top view of an annular bottom contact region taken from section lines 6A of FIG. 6.

FIG. 6A is a top view of annular contact region 510 taken from section lines 6A of FIG. 6. The top view shows the geometric nature of annular contact region 510 as well as the exposed mesa 130 that is at the center of annular contact region 510. Contact insulator 150 surrounds annular contact region 510 and insulates memory device 600 from surrounding structures.

Figure 7:
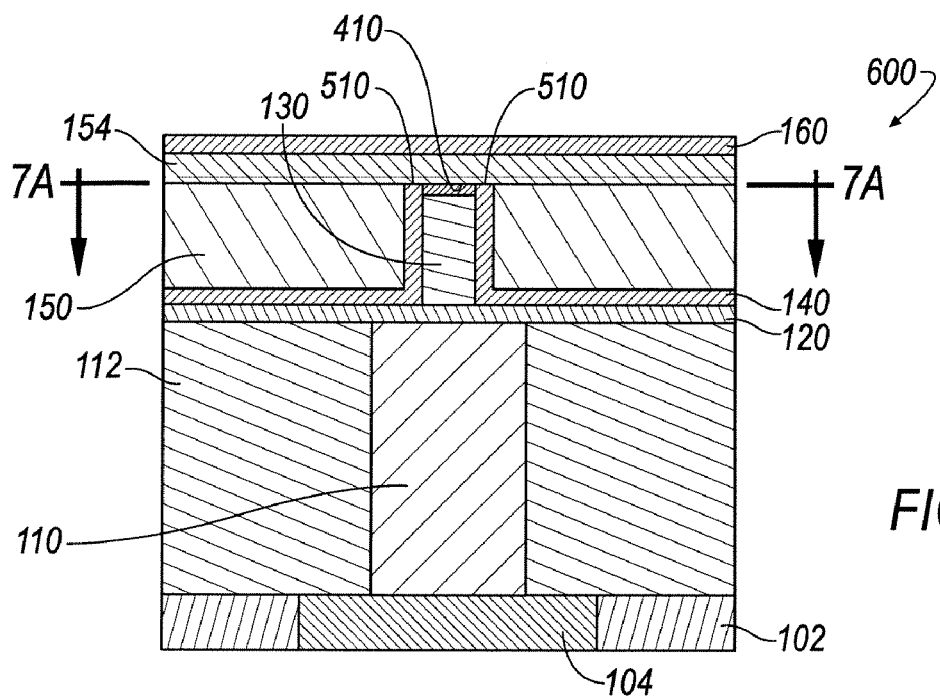
FIG. 7 is a cross-sectional view of an alternative phase-change memory device.

FIG. 7 is a cross-sectional view of an alternative embodiment of phase-change memory device 600 in which a spacer 410 is included atop mesa 130. In this embodiment, spacer 410 is positioned within annular contact region 510 and contacts phase-change layer 154. Spacer 410 may be at the same planar level as annular contact region 510 and contact insulator 150.

Figure 7A:
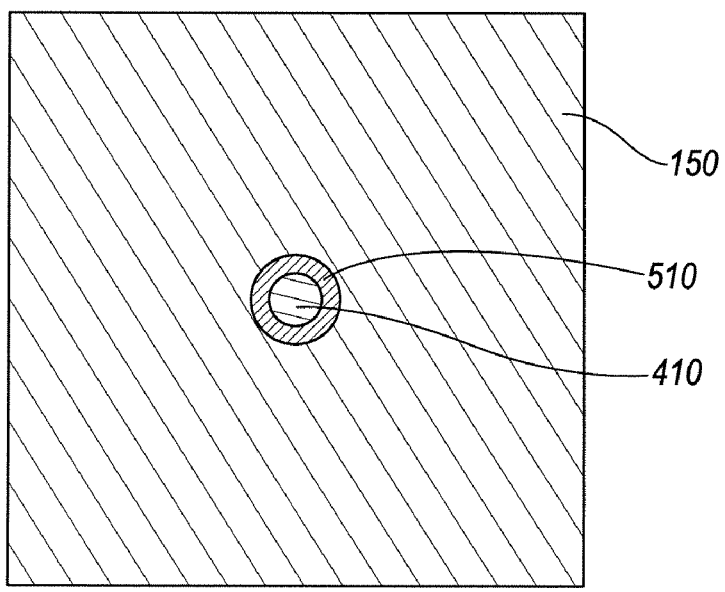
FIG. 7A is a top view of an annular bottom contact region taken from section lines 7A of FIG. 7.

FIG. 7A is a top view of annular contact region 510 taken from section lines 7A of FIG. 7, which correspond to a cross-section that coincides with lower interface of phase-change layer 154. The top view shows spacer 410 positioned within annular contact region 510. Contact insulator 150 surrounds annular contact region 510.

Figure 8:
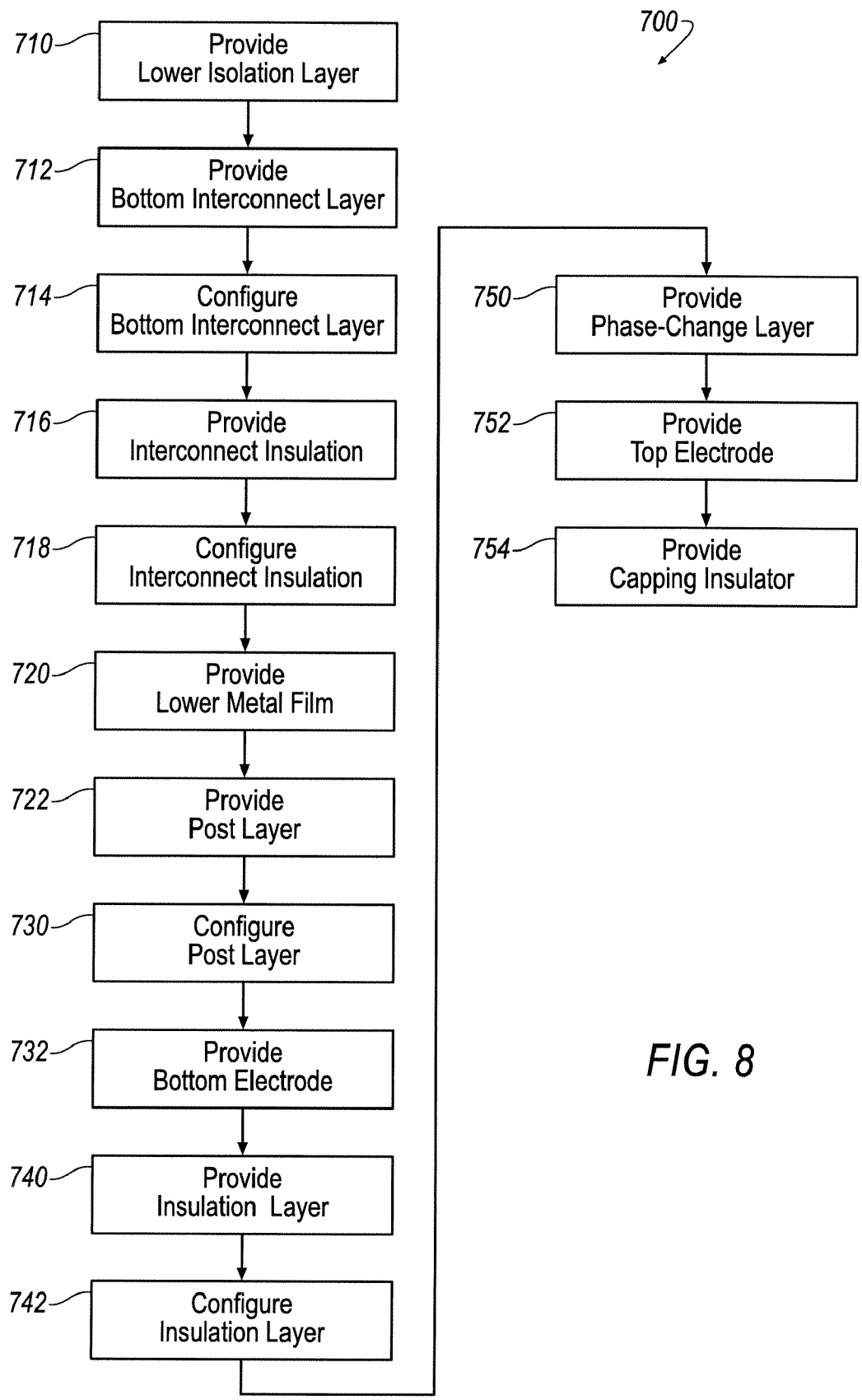
FIG. 8 is a flow diagram of the construction of the phase-change memory devices of FIGS. 1, 4C, 6.

FIG. 8 is a flow diagram 700 of the construction of phase-change memory device 100, 400, 600 of FIGS. 1, 4C, 6. Steps 710-718 are illustrative of representative processing associated with forming an underlying structure. The scope of the invention is not limited to a particular underlying structure and extends more generally to any underlying structure. In step 710, lower isolation layer 102 is provided. Lower isolation layer 102 may be made of $SiO_2$ (silicon dioxide), or other insulators, and may be deposited by techniques such as chemical vapor deposition (CVD), physical vapor deposition (PVD), or sputtering. As is known in the art, $SiO_2$ (silicon dioxide) is a common insulator in semiconductor device technology. Lower isolation layer 102 generally provides electrical and thermal isolation from any structures that memory device 100 may be constructed on top of. Further, lower isolation layer 102 may be provided on top of a wafer that includes semiconductor elements where memory device 100 is to be constructed above or within typical interconnect strata. That is to say, lower isolation layer 102 may be provided on top of a substrate that contains no circuits, partial, or complete circuits and systems that are to be used in conjunction with memory device 100. Alternatively, lower isolation layer 102 may itself be a glass or silicon wafer of suitable properties for constructing memory device 100. Lower isolation layer 102 may be etched or otherwise processed to form an opening in which lower conductive layer 104 may be formed. After forming lower conductive layer 104, the upper surface may be subjected to a CMP process to planarize the surface or remove excess amounts of the material used to form lower conductive layer 104.

Next, in step 712, a layer is provided that will become bottom interconnect 110. Bottom interconnect 110 is typically a metal such as aluminum, tungsten, or copper and may be deposited techniques such as sputtering or evaporation. As memory device 100 may be constructed between steps in a semiconductor process, bottom interconnect 110 may be deposited along with other interconnect lines for other circuitry constructed on the substrate.

Next, in step 714, bottom interconnect 110 is configured. An etch process is used to create patterns in the deposited metal provided in step 712. The configured bottom interconnect 110 may be patterned as traces/interconnects and/or other features.

Next, in step 716, interconnect insulation layer 112 is provided. Interconnect insulation layer 112 may be a $SiO_2$ (silicon dioxide), SiN (silicon nitride), or other oxide or nitride material and may be deposited by chemical vapor deposition (CVD), physical vapor deposition (PVD), or sputtering. For improved performance, interconnect insulation layer 112 may be selected for reduced thermal conductivity. Preferably, the thermal conductivity is less than that of $SiO_2$ (silicon dioxide) to provide increased retention of heat in phase-change layer 154 during programming operations. Alternative materials for contact insulator 150 may include, but are not limited to, carbide materials, Aerogel, Xerogel and their derivatives. Typically, interconnect insulation layer 112 may comprise a material such as silicon dioxide ($SiO_2$) or silicon nitride ($Si_3N_4$). In a preferred embodiment, silicon dioxide ($SiO_2$) is used. In a more preferred embodiment, silicon nitride ($Si_3N_4$) is used.

Next, in step 718, interconnect insulation layer 112 is configured and excess material from the deposition of interconnect insulation layer 112 is removed. Interconnect insulation layer 112 was formed using a deposition across the entirety of the surface of bottom interconnect 110 and over lower isolation layer 102. Thus, the excess material that is above bottom interconnect 110 is to be removed so that bottom interconnect 110 is not covered by insulative material. The excess insulator material is removed using a chemical mechanical polishing (CMP) process. Generally, the horizontal surface of interconnect insulation layer 112 is cleaned by removing the excess material to provide a generally planar surface. When complete, bottom interconnect 110 remains as exposed for electrical connection to lower metal film 120 and first electrode 140 (provided in later steps).

Next, in step 720, optional lower metal film 120 is provided and configured. Optional lower metal film 120 is deposited over the generally planar surface of bottom interconnect 110 and interconnect insulation layer 112. A physical vapor deposition (PVD) process may be used to conformally deposit optional lower metal film 120 to cover bottom interconnect 110 and interconnect insulation layer 112. Optional lower metal film 120 may also be used as an etch-stop used to prevent further patterning of either feature in subsequent manufacturing processes. The material for optional lower metal film 120 may be selected to reduce metal migration between bottom interconnect 110 and first electrode 140. That is to say, optional lower metal film 120 may behave as a barrier to metal migration between bottom interconnect 110 and first electrode 140. After deposition, optional lower metal film 120 may be patterned so that it does not connect with adjacent circuits or other memory devices.

Next, in step 722, an insulator layer is provided that will become mesa 130. Mesa 130 may be deposited by chemical vapor deposition (CVD), physical vapor deposition (PVD) or sputtering. In an example, mesa 130 may comprise a material such as silicon dioxide ($SiO_2$) or silicon nitride ($Si_3N_4$). In one embodiment, silicon dioxide ($SiO_2$) is used. In another embodiment, silicon nitride ($Si_3N_4$) is used. If optional lower metal film 120 is not included in the structure, the insulator that will become mesa 130 is deposited directly over bottom interconnect 110 and interconnect insulation layer 112.

In the embodiment of memory device 400 (shown in FIG. 4C) or memory device 600 (shown in FIG. 7), spacer 410 is deposited over the insulator layer that will become mesa 130. Spacer 410 may function during manufacturing as an etch-stop, a CMP stop, and/or as a spacer. In one embodiment, spacer 410 is carbon. In another embodiment, spacer 410 is carbon nitride. The spacer 410 may be patterned as an etch-stop or CMP stop for defining the shape and constructing mesa 130. The overall height H of upper portion 144 (above optional lower metal film 120) may be determined by the height of mesa 130 and the thickness of spacer 410. The thickness of spacer 410 may be modified through the deposition process to adjust the height of the post structure created by mesa 130 and spacer 410. Thus, a thick layer of deposited material for spacer 410 creates a "tall" mesa 130 post structure and a thin layer of deposited spacer 410 material creates a "short" mesa 130 post structure.

Next, in step 730, mesa 130 is configured. Using a reactive ion etching (RIE) process, mesa 130 is formed from the layer of insulator material deposited in step 722. Depending upon the process parameters used, mesa 130 may be configured as a sublithographic feature. The etching process is timed such that the insulator material remaining as mesa 130 (see FIG. 1) has the desired predetermined size.

In production, parameters such as etching time, angle, etc., may be adjusted such that mesa 130 is left from the layer surrounding insulating material has been etched. After etching, mesa 130 remains as a post structure for first electrode 140 to be built upon. When mesa 130 is configured having a sublithographic dimension, upper portion 144 is also reduced in size. Thus, the contact area of first contact region 146 is reduced. Such a reduction in size is desirable, in an example, to increase the current density through phase-change layer 154.

Next, in step 732 first electrode 140 is provided. First electrode 140 is typically a metal or metal alloy (e.g. Ti, TiAlN, TiSiN, TiN) and may be deposited by sputtering or evaporation. First electrode 140 is formed over mesa 130 (see FIG. 1) and electrically communicates with bottom interconnect 110 through optional lower metal film 120. Because mesa 130 was formed using reactive ion etching (RIE), upper portion 144 of first electrode 140 may have a sublithographic size when deposited. First electrode 140 may then be patterned to insure isolation of adjacent devices in an array.

Next, in step 740, contact insulator 150 is provided. Contact insulator 150 may be a $SiO_2$ (silicon dioxide) material and may be deposited by chemical vapor deposition (CVD), physical vapor deposition (PVD), or sputtering. For improved performance, contact insulator 150 may be selected for reduced thermal conductivity. Preferably, the thermal conductivity is less than that of $SiO_2$ (silicon dioxide) to provide increased retention of heat in phase-change layer 154 during programming operations. Generally, $SiO_2$ (silicon dioxide) has a thermal conductivity of less than the order of about 1.0. The alternative materials for contact insulator 150 may include, but are not limited to, carbide materials, nitride materials, aerogels, xerogels and their derivatives. Typically, contact insulator 150 may comprise a material such as silicon dioxide ($SiO_2$) or silicon nitride ($Si_3N_4$). In a preferred embodiment, silicon dioxide ($SiO_2$) is used. In a more preferred embodiment, silicon nitride ($Si_3N_4$) is used.

Next, in step 742, contact insulator 150 is configured and excess material from the deposition of contact insulator 150 is removed. Contact insulator 150 was formed using a deposition across the entirety of the surface of first electrode 140. For the embodiments described above with respect to memory devices 100 (FIG. 1) and 400 (FIG. 4C), the excess that is above first electrode 140, and in particular the excess above first contact region 146, is to be removed. This removal of insulator material provides that first contact region 146 is exposed. The excess insulator material may be removed using a chemical mechanical polishing (CMP) process. Generally, the horizontal surface of contact insulator 150 is cleaned by removing the excess material to provide a planar surface. When complete, first contact region 146 remains as exposed for electrical connection phase-change layer 154 (provided in a later step).

For the embodiment described above with respect to memory device 600 of FIG. 6, the excess insulator material and upper portion 144 is removed. Typically using CMP, the process is as discussed above but also continues to remove upper portion 144 to configure annular contact region 510. Thus, for memory device 600, upper portion 144 is removed and the upper end of vertical portion 142 remains as annular contact region 510. For the embodiment of memory device 600 of FIG. 7, the excess of contact insulator 150 and first electrode 140 that is above spacer 410 is to be removed to expose the upper surface of spacer 410. Upper portion 144 is removed and the upper end of vertical portion 142 remains as annular contact region 510.

Next, in step 750, phase-change layer 154 is provided. Typically, GST225 is deposited in a layer. Other phase-change or switching materials may also be used as discussed above with respect to FIG. 1, including chalcogenide alloys, pnictide alloys or threshold switching alloys. Because any excess material that was above contact insulator 150 was removed in step 742, the surface of contact insulator 150 is generally planer. Thus, phase-change layer 154 is provided as a substantially flat layer over the CMP polished surface. Moreover, because first contact region 146 (or annular contact region 510 in the case of memory device 600) is exposed at the surface of contact insulator 150, there is an electrical communication between phase-change layer 154 and first contact region 146 when phase-change layer 154 is deposited. Optionally, after phase-change layer 154 is provided, a conductive layer (e.g., a carbon or etch-stop) may be deposited over phase-change layer 154 to protect the phase-change material (which may be subject to damage) from other etching processes later employed.

Next, in step 752, second electrode 160 is provided. Typically, second electrode 160 is metallic and is deposited by sputtering or evaporation. When deposited, second electrode 160 is a layer that electrically communicates with phase-change layer 154. Second electrode 160 and phase-change layer 154 may be further patterned to separate memory device 100, 400, or 600 from adjacent memory devices when produced in an array.

Next, in step 754, a capping insulator is provided to isolate memory device 100, 400, 600 electrically and thermally from other circuits or structures that may be constructed over memory device 100. The capping insulator may be made of $SiO_2$ (silicon dioxide), or other insulators, and may be deposited by techniques such as chemical vapor deposition (CVD). As is known in the art, $SiO_2$ (silicon dioxide) is a common insulator in semiconductor device technology.

The embodiments disclosed herein relate to bottom contact phase-change memory devices formed with a mesa. Such devices may include first contacts having a closed geometric region, such as a rectangular or rectilinear region, or an annular region. However, the disclosure is not limited only to these embodiments. Thus, the teachings herein are also applicable to these devices and others. The embodiments disclosed herein are merely examples of how to implement an improved phase-change memory device, including a mesa for configuring a first electrode and a phase-change material between the first and second electrode. Additionally, it is also possible to have thin conductive layers between each contact region and the phase-change material to provide an etch-stop layer, to provide a CMP-stop layer, to alter the resistance of the contact region, and/or to reduce metal migration.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. An electronic device comprising:
    an insulative mesa having a top surface, a bottom surface and a sidewall surface that connects the top surface to the bottom surface;
    a support layer having a top surface and a bottom surface, wherein the top surface of the support layer includes a first portion and a second portion, wherein the bottom surface of the insulative mesa is disposed upon the first portion of the top surface of the support layer;
    a first electrode having a top surface and a bottom surface, wherein a portion of the top surface of the first electrode forms at least one first contact region, wherein the bottom surface of the first electrode is disposed upon
        the second portion of the top surface of the support layer, and
        at least the sidewall surface of said insulative mesa;
    an active material having a top surface and a bottom surface, wherein the active material is disposed upon the at least one first contact region; and
    a second electrode having a top surface and a bottom surface, wherein a portion of the bottom surface of the second electrode forms at least one second contact region, wherein the at least one second contact region is disposed upon the top surface of the active material.

2. The device of claim 1, wherein said insulative mesa forms a sublithographic post.

3. The device of claim 1, wherein the bottom surface of the first electrode is further disposed upon
    the top surface of said insulative mesa.

4. The device of claim 1, wherein said first contact region includes a circular, disk-shape.

5. The device of claim 1, wherein said first contact region includes an annular, ring-shape.

6. The device of claim 1, wherein the support layer includes a lower metal film, wherein said lower metal film is in electrical communication with said first electrode.

7. The device of claim 6, further comprising
a bottom interconnect disposed adjacent the bottom surface of the support layer, wherein said bottom interconnect is in electrical communication with said support layer.

8. The device of claim 1, further comprising
a carbon-based etch-stop-spacer having a top surface and a bottom surface, wherein the bottom surface of the etch-stop-spacer is disposed upon the top surface of the insulative mesa, wherein the bottom surface of the first electrode is disposed upon the top surface of the etch-stop spacer such that the etch-stop spacer is located between said insulative mesa and said first electrode.

9. The device of claim 1, wherein said active material includes one or more elements selected from the group consisting of:
Te, Se, Ge, Sb, Bi, Pb, Sn, As, S, Si, P, O and mixtures or alloys thereof.

10. The device of claim 1, wherein said insulative mesa comprises
a silicon-based insulating material including silicon dioxide ($SiO_2$) or silicon nitride ($Si_3N_4$).

11. The device of claim 1, further comprising
a substrate including a base wafer having circuitry, wherein said insulative mesa protrudes from said substrate.

12. The device of claim 1, wherein said first electrode is further arranged over said top surface of said insulative mesa.

13. The device of claim 1, further comprising
a carbon-based etch-stop-spacer having a top surface and a bottom surface, wherein the bottom surface of the etch-stop-spacer is disposed upon the top surface of the insulative mesa, wherein the bottom surface of the active material is disposed upon the top surface of the etch-stop spacer such that the etch-stop spacer is located between said insulative mesa and said active material.

14. The device of claim 13, wherein said spacer is arranged to contact said top surface of said insulative mesa.

15. The device of claim 14, wherein said spacer is arranged to contact said active material.

16. The device of claim 1, wherein said active material includes a chalcogenide phase-change memory material.

17. The device of claim 1, wherein said active material includes an amorphous chalcogenide or pnictide switching material.

18. An electronic device comprising:
an insulative mesa having a top surface, a bottom surface and a sidewall surface that connects the top surface to the bottom surface;
a support layer having a top surface and a bottom surface, wherein the top surface of the support layer includes a first portion and a second portion, wherein the bottom surface of the insulative mesa is disposed upon the first portion of the top surface of the support layer;
a first electrode having a top surface and a bottom surface, wherein a first portion of the top surface of the first electrode forms at least one first contact region, wherein a second portion of the top surface of the first electrode forms a non-contact region, wherein the bottom surface of the first electrode is disposed upon the second portion of the top surface of the support layer, and
at least the one sidewall surface of said insulative mesa;
a contact insulation layer having a top surface and a bottom surface, wherein the bottom surface of the contact insulation layer is disposed upon the second portion of the top surface of the electrode, wherein the top surface of the contact insulation layer is coplanar with said first portion of the top surface of the first electrode that forms the at least one first contact region;
an active layer having a top surface and a bottom surface, wherein the active material is disposed upon the top surface of the contact insulation layer and the first portion of the top surface of the first electrode that forms the at least one first contact region; and
a second electrode having a top surface and a bottom surface, wherein a portion of the bottom surface of the second electrode foams at least one second contact region, wherein the at least one second contact region is disposed upon the top surface of the active material.

19. The device of claim 18, further comprising
a spacer having a top surface and a bottom surface, wherein the bottom surface of the etch-stop-spacer is disposed upon the top surface of the insulative mesa, wherein the spacer is disposed between said insulative mesa and said first contact region of the first electrode.

20. The device of claim 19, wherein said spacer includes a carbon-based etch-stop material.

21. The device of claim 18, wherein said insulative mesa forms a sublithographic post.

22. The device of claim 18, wherein said first contact region includes at least one of
a circular, disk shape, and
an annular, ring-shape.

23. The device of claim 18, wherein said phase-change material includes one or more elements selected from the group consisting of:
Te, Se, Ge, Sb, Bi, Pb, Sn, As, S, Si, P, O and mixtures or alloys thereof.

24. The device of claim 18, wherein said insulative mesa comprises
a silicon-based insulating material including silicon dioxide ($SiO_2$) or silicon nitride ($Si_3N_4$).

25. The device of claim 18, further comprising
a substrate including a bas wafer having circuitry, wherein said insulative mesa protrudes from said substrate.

26. The device of claim 18, wherein said first electrode is further arranged over said sidewall surface of said insulative mesa.

27. The device of claim 18, wherein said active material includes a chalcogenide phase-change memory material.

28. The device of claim 18, wherein said active material includes an amorphous chalcogenide or pnictide switching material.

29. The device of claim 1, wherein the bottom surface of the insulative mesa is directly disposed upon the first portion of the top surface of the support layer.

30. The device of claim 1, wherein the bottom surface of the first electrode is directly disposed upon the second portion of the top surface of the support layer.

31. The device of claim 18, wherein the bottom surface of the insulative mesa is directly disposed upon the first portion of the top surface of the support layer.

32. The device of claim 18, wherein the bottom surface of the first electrode is directly disposed upon the second portion of the top surface of the support layer.

* * * * *

UNITED STATES PATENT AND TRADEMARK OFFICE
CERTIFICATE OF CORRECTION

| | | |
|---|---|---|
| PATENT NO. | : 7,906,772 B2 | Page 1 of 1 |
| APPLICATION NO. | : 11/849632 | |
| DATED | : March 15, 2011 | |
| INVENTOR(S) | : David Sargent et al. | |

It is certified that error appears in the above-identified patent and that said Letters Patent is hereby corrected as shown below:

Column 16, line 17, delete "foams" and insert -- forms --.

Please correct Claim 25 as follows:

Column 16, line 42, delete "bas" and insert -- base --.

Signed and Sealed this
Tenth Day of January, 2012

David J. Kappos
*Director of the United States Patent and Trademark Office*